United States Patent [19]

Saunders

[11] Patent Number: 4,680,484
[45] Date of Patent: Jul. 14, 1987

[54] WIRED-AND FET LOGIC GATE

[75] Inventor: Chris H. Saunders, Huntington Beach, Calif.

[73] Assignee: TRW Inc., Redondo Beach, Calif.

[21] Appl. No.: 663,004

[22] Filed: Oct. 19, 1984

[51] Int. Cl.$^4$ ............................................. H03K 19/094
[52] U.S. Cl. ..................................... 307/448; 307/443; 307/450
[58] Field of Search ............... 307/443, 446, 450, 448, 307/475

[56] References Cited

U.S. PATENT DOCUMENTS

| 4,404,480 | 9/1983 | Ransom et al. | 307/475 |
| 4,405,870 | 9/1983 | Eden | 307/446 |
| 4,418,291 | 11/1983 | Watson, Jr. | 307/443 |
| 4,485,316 | 11/1984 | Nuzillat et al. | 307/450 X |

OTHER PUBLICATIONS

Nuzillat et al., "Low Pinch-Off Voltage F.E.T. Logic (L.P.F.L.): LSI Oriented Logic Approach Using Quasi-Normally Off GaAs MESFETs"; IEEE Proc., vol. 127, Pt. 1, No. 5, pp. 287-296; 10/1980.

Primary Examiner—Stanley D. Miller
Assistant Examiner—D. R. Hudspeth
Attorney, Agent, or Firm—Noel F. Heal; Robert J. Stern

[57] ABSTRACT

A logic gate for use as a fundamental building block in more complex digital circuitry. The logic gate has multiple wired-AND input circuits, each capable of accepting multiple inputs, and each connected to a single pull-up field-effect transistor (FET), and to a common power supply. The wired-AND input circuits are ORed together and their signals level-shifted by diodes, before application to a FET output circuit that has one gate terminal and multiple drain output terminals. To facilitate expansion of the logic, these output terminals are connectable, either singly or together with outputs from other similar gates, as inputs to similar gates. The logic gate of the invention has a very low parts count compared with other logic topologies for the same purpose, and has an extremely favorable propagation delay-power product.

5 Claims, 7 Drawing Figures

WIRED-AND FET LOGIC GATE

BACKGROUND OF THE INVENTION

This invention relates generally to semiconductor logic gates, and more particularly, to logic gates employing field-effect transistors (FET's). In many applications of integrated circuitry, it is desirable to employ a basic logic circuit repeatedly, as a "building block" for more complex circuitry. Using a standard, repeatable logic circuit simplifies both design and fabrication.

The practicality of such an approach follows from well known theorems of Boolean algebra, in accordance with which practically any complex logical relationships among sets of digital signals can be reduced or transformed to a set of different relationships employing a single logic gate repeatedly.

For example, complex logic can be performed by interconnected combinations of a basic multi-input NOR gate. Logical functions, such as NOR, may be defined in various ways: either in terms of binary values, or true-or-false values, or different voltage levels. In terms of binary values, referred to as logic-1 and logic-0, respectively, the output of a NOR gate is a logic-1 output only if none of the inputs is a logic-1 value. If any one or more of the inputs is a logic-1, the logical OR of the inputs is also a logic-1, and the logical NOR of the inputs is a logic-0. It is possible to constrct much more complex logic using the NOR gate as the basic building block. It is equally possible to employ a NAND gate as the basic logic circuit, or a combination gate employing both OR and NAND functions.

Although theory allows the use of different gate structures as the basic logic gate, not all logic gates are equally advantageous in practice, and those that have been used or proposed prior to this invention have some significant drawbacks. A frequently used comparative measure for integrated circuits is the so-called speed-power product, which is more properly the propagation delay-power product. Ideally, both the propagation delay inherent in a circuit and the power dissipated in the circuit should be minimized. Hence the product of these two parameters, or the two considered separately, provide a good measure for comparing circuits that perform similar functions. As will be discussed in more detail, prior-art logic gate topologies are still in need of improvement in this respect.

Another important consideration in logic gate design is that the selected topology must permit expansion and interconnection of like logic gates in multiple stages. In general, this means that the ideal gate should accommodate multiple inputs and provide multiple outputs compatible with the inputs. Again, existing logic topologies do not meet this requirement in all respects.

It will be appreciated from the foregoing that there is still a significant need for a logic gate having a desirably low propagation delay-power product, and having the capability of being interconnected with like gates for purposes of forming more complex circuitry. As will next be described in summary form, the present invention satisfies this need.

SUMMARY OF THE INVENTION

The present invention resides in a novel combination logic gate for use in connection with like gates in the design of more complex digital circuitry, to facilitate expandability, and to provide low power dissipation, relatively small time delays, and a smaller number of parts than conventional logic structures for the same purpose.

Briefly, and in general terms, the logic gate of the invention comprises a plurality of wired-AND input circuits, each of which has a single pull-up field-effect transistor (FET) and is connectable to a plurality of input signal lines to be logically ANDed together, and a FET output circuit having a common gate circuit and multiple independent drain output lines. The multiple output lines are connectable to input lines of like logic circuits, and the logic gate of the invention also includes circuit means for logically ORing the plurality of wired-AND input circuits and applying the resultant signal to the gate of the FET output circuit. The FET output circuit provides multiple outputs through its multiple drain connections. This single-gate, multiple-drain FET acts as a voltage pull-down circuit when one or more of the outputs is applied as an input to another like logic circuit.

In the illustrative embodiment of the invention, the circuit means includes a diode for coupling each of the plurality of input circuits to a common junction point, an additional diode connected between the common junction point and the gate circuit of the FET output circuit, and a pull-down FET connected between the gate circuit of the FET output circuit and a voltage source.

When all of the input circuits connected to one of the wired-AND inputs are in a logic-1 condition, no current sink or voltage pull-down is provided by the input circuits. Consequently, current flows through two of the diodes and through the pull-down FET in the circuit means connected to the gate of the FET output circuit. As a result of this current, voltage at the gate of the output FET circuit rises to near zero, and the output FET is turned on, i.e. it presents a logic-0 output and acts as a pull-down FET for any subsequent stage to which any output is connected. The same reasoning applies to all of the wired-AND input circuits, which are effectively ORed together at the diode junction point. The logic gate of the invention is basically a combination AND-OR-INVERT gate. The inputs are first ANDed in groups, then the results of the ANDing operations are ORed together, and the final result is inverted before output. A logic-1 output results if each wired-AND input circuit has at least one logic-0 input signal applied to it. If, for example, there are two wired-AND input circuits, and each has two input signals, designated A, B, and C, D, then the output signal on each of output lines is given by:

$$F_N = \overline{A.B + C.D},$$

where the symbols "." and "+" have their usual meanings of AND and OR, respectively, and the overlining signifies signal inversion.

It will be appreciated from the foregoing that the present invention represents a significant advance in the field of logic topology for integrated circuit design. In particular, the circuit of the invention provides a standard logic circuit or gate having multiple inputs and independent multiple outputs, wherein the outputs may serve as inputs to subsequent stages of an integrated circuit. In addition, the circuit of the invention has fewer parts and a lower power dissipation than other structures intended for the same purposes, and has a relatively low inherent time delay. Other aspects and advantages of the invention will become apparent from the following more detailed description, taken in conjunction with the accompanying drawings.

DESCRIPTION OF THE PREFERRED EMBODIMENT

Figure 1:
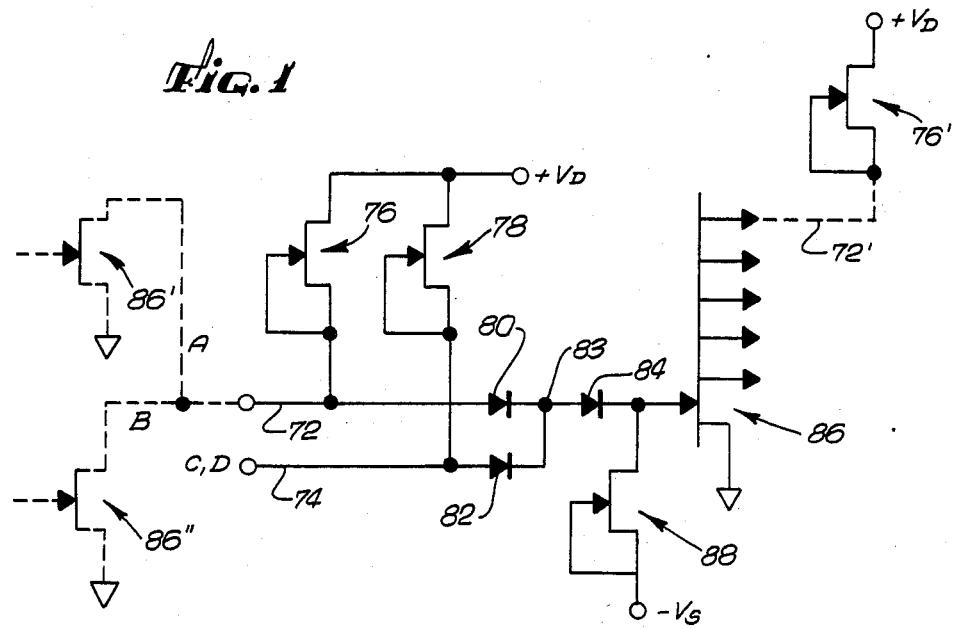
FIG. 1 is a schematic diagram of a wired-AND FET logic gate constructed in accordance with the present invention.

As shown in the drawings for purposes of illustration, the present invention is concerned with a field-effect transistor (FET) logic gate for use as a basic logic topology for construction more complex integrated circuitry. Various approaches have been suggested for structuring a basic logic gate, some of which will be briefly described before describing the invention in detail.

Figure 5:
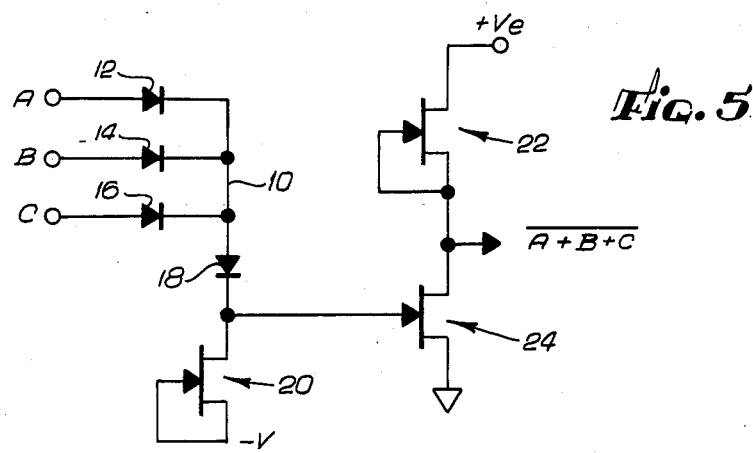
FIG. 5 is a schematic diagram of a prior-art logic gate employing Schottky diode FET logic (SDFL)

One standard approach is to use the Schottky diode FET logic (SDFL) gate shown in FIG. 5. This is a NOR gate in which the multiple inputs A, B and C are coupled to a common junction point, indicated by reference numeral 10, through separate diodes 12, 14 and 16. An additional diode 18 is connected between the junction point 10 and the drain terminal of a pull-down FET 20. The gate and source terminals of the FET 20 are connected together and to a negative voltage $-V$.

The terms "pull-up" FET and "pull-down" FET are commonly used in FET logic design to define the function of each FET in the logic. A pull-up FET serves much the same function as a pull-up resistor in other forms of logic. A pull-up resistor is connected to a (usually positive) power supply at one end, and its other end has a voltage level of interest. So long as little or no current flows through the resistor, the voltage level is "pulled up" to that of the power supply. When a current is drawn through the resistor, the voltage is "pulled down" to a lower level. Since resistors cannot be efficiently fabricated in FET in integrated circuits, FET's are themselves used as pull-up devices. A depletion-mode FET with its gate and source terminals connected together is typically used as a pull-up FET. Since the gate-source voltage is zero, the FET is always turned on, but will not be conductive unless a current "sink" or pull-down device is conditioned to draw current through the pull-up FET. When no current flows through the pull-up FET, the voltage at its source terminal is pulled up to the supply voltage level, but when current flows through the pull-up FET, the source voltage is pulled down to a lower level.

The logic gate in the SDFL circuit also includes an inverting output circuit having a pull-up FET 22 and a pull-down FET 24 connected in series between a positive voltage V and ground. An output signal is taken off at the junction between these two FET's. The application of a logic-1 signal to any of the inputs A, B or C causes pull-down FET 20 to become conductive. The drain terminal of this FET 20 is connected to the gate of FET 24, which therefore also becomes conductive. Thus the voltage at the output of the circuit is pulled down to a logic-0 level on the occurrence of a logic-1 signal at one or more of the inputs, resulting in a NOR function. To accommodate output fan-out requirements, i.e., the need to provide parallel output lines from the circuit, the output inverter FET's 22 and 24 must be increased in size. The pull-up FET 22 has to accommodate all possible variations of fan-out configurations, and therefore has to supply current to multiple pull-down FET's 20, which can be located anywhere on a circuit chip. For high fan-outs, i.e. large numbers of parallel outputs from a gate, the speed and power characteristics are adversely affected in this circuit.

Figure 7:
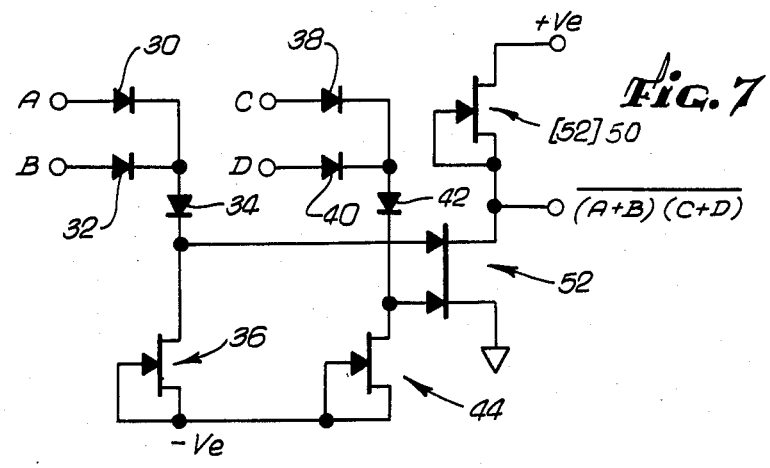
FIG. 7 is a schematic diagram of a prior-art logic gate employing diode FET logic (DFL).

FIG. 7 is an example of diode FET logic, namely a combination OR-NAND gate. It will be observed that there are two OR gates that have some similarity to the input end of the SDFL circuit of FIG. 5. One OR gate comprises diodes 30 and 32 in input lines A and B, a third diode 34, and a pull-down FET 36. Diodes 38, 40 and 42, and pull-down FET 44 provide the second OR gate, for inputs C and D. The NAND function is provided by a pull-up FET 50 and a dual-gate FET 52 connected in series between a positive voltage source and ground. The outputs from the two OR gates are applied to the two gates of FET 52, and the output is derived from the junction between the FET's 50 and 52. Although the DFL circuit provides for the NANDing of signals, practicalities of fabrication limit the structure to no more than two NAND or AND input quantities. Moreover, the speed of the circuit is limited by the series resistance of the FET's. The dual-gate FET 52 is in practice formed as two series-connected FET's.

Figure 6:
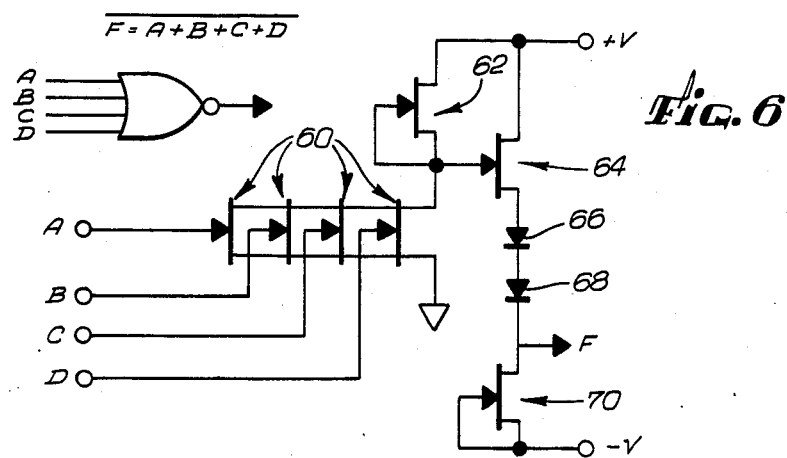
FIG. 6 is a schematic diagram of a prior-art logic gate employing buffered FET logic (BFL)

Another NOR gate structure, known as buffered FET logic (BFL) is shown in FIG. 6. In this logic, a plurality of input FET's 60 are connected in parallel with each other and in series with a pull-up FET 62. A separate input is applied to each gate of the FET's 60. If any of the FET's 60 is turned on, it functions to pull down the voltage at the source terminal of FET 62. This signal is applied to the gate terminal of another FET 64, and appears as an inverted output F after buffering by the circuit comprising two diodes 66 and 68, and a pull-down FET 70. Like the SDFL circuit, the BFL circuit has no AND or NAND function. Moreover, it includes a relatively large number of components, and therefore has a relatively high power consumption.

In accordance with the invention, a combination logic gate is provided with multiple AND input lines, and multiple independent output lines, the output lines being connectable as inputs to other logic stages, to facilitate expansion of the logic. The logic gate of the invention is not only easily expandable, but has a low power consumption and a relatively low propagation delay.

As shown by way of example in FIG. 1, the logic gate of the invention has multiple wired-AND input circuits 72 and 74, connected to a single power supply $+V_D$ through two separate pull-up FET's 76 and 78, respectively. For purposes of illustration, input circuit 72 is shown as having inputs A and B wired to it, and input circuit 74 is shown as having inputs C and D. Input circuit 72 is also connected to the anode terminal of a diode 80, and input circuit 74 is connected to the anode terminal of another diode 82. The cathodes of the two diodes are connected to a junction point 83, and thence through a third diode 84 to the gate of a FET 86, which is also connected through a pull-down FET 88, the source terminal of which is connected to a negative power supply $-V_S$. The FET 86 has a single gate terminal, a single source terminal connected to ground, and multiple drain terminals to provide multiple outputs or fanout from the entire circuit.

The inputs, A and B for example, are derived from output lines like those shown emanating from the multiple drain terminals of FET 86, but supplied, of course, from another copy of the standard logic gate of the invention. Thus, if there are two inputs A and B coupled to pull-up FET 76, there will be two FET's like the one shown at 86, connected to the input circuit 72. These are shown by way of example at 86' and 86". If either one, or both, of the FET's 86' and 86" are in a conductive state, they act as pull-down FET's, and the voltage on input circuit 72 is pulled down to a low level. If neither FET 86' nor FET 86" is conductive, the voltage on line 72 is pulled up to a positive level by pull-up FET 76, and current will flow through diodes 80 and 84, and then through FET 88. Without this current flow the voltage at the gate terminal of FET 86 is at a negative level, due to the negative power supply $-V_S$. When current flows through FET 88, the voltage at the gate terminal of FET 86 rises to near zero, which has the effect of turning the FET 86 on. In this condition, FET 86 acts as a pull-down FET for input circuits to which it is connected, like the one shown by way of example at 72', having a pull-up FET 76'. When FET 86 is off, its active outputs are at a positive voltage level, as a result of the pull-up action of FET 76', but when FET 86 is turned on, the voltages at its outputs are pulled down to a near-zero level.

It will be understood that the FET 86 operates in what is known as the depletion mode. A FET becomes conductive, and current flows between its source and drain terminals when the gate-source voltage is raised above a predetermined threshold level. For depletion-mode FET's, the threshold level is below zero. The FET is therefore conductive when the gate-source voltage is zero, and is non-conductive when the gate-source voltage is at a negative value below the threshold.

Figure 2:
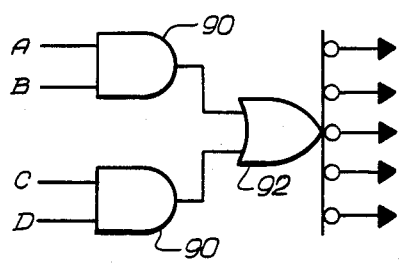
FIG. 2 is a logic diagram equivalent to the schematic of FIG. 1.

FIG. 2 shows the logic-diagram equivalent of the circuit of the invention. It includes two AND gates 90 and one OR gate 92 with multiple inverted outputs. The function of the OR gate 92 is performed at the junction 83 (FIG. 1) between diodes 80, 82 and 84. As has been described, so long as there are no conductive FET's connected to input 72, there is conduction through FET 88, and the output FET 86 is also turned on. Similarly, if there are no conductive FET's corresponding to the inputs C and D on line 74, there will be current conduction through diodes 82 and 84, and FET 86 will be turned on. Therefore, an "on" output condition will result if either A and B are both off, or C and D or both off. The "off" condition is one in which there is a positive voltage present. Using a positive logic convention, a positive voltage is equivalent to logic-1 and a zero voltage is equivalent to logic-0. Therefore, "off" is logic-1 and "on" is logic-0, and the logic equation for the circuit is:

$$F_N = \overline{A \cdot B + C \cdot D,}$$

where $F_N$ is the output, the symbols "." and "+" have their usual meaning of AND and OR, respectively, and the overlining indicates inversion.

The diodes 80, 82 and 84 perform the ORing function at the junction 83 and a level-shifting function to facilitate use of the output FET 86. It will be understood, however, that the diodes may not be needed if an enhancement-mode FET is employed at the output, and no level-shifting is required.

Figure 3:
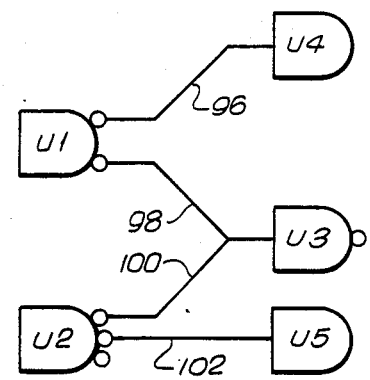
FIG. 3 is a fragmentary logic diagram showing an example of interconnected logic gates of the invention.

FIG. 3 shows how multiple logic gates of the invention can be interconnected. The gates U1–U5 are each equivalent to the circuitry of FIG. 1. Gate U1 has two outputs on lines 96 and 98 coupled as inputs to gates U4 and U3, respectively. Gate U2 has two outputs 100 and 102 coupled to gates U3 and U5, respectively. The lines 98 and 100 are wired-ANDed for input to gate U3. If, for example, the outputs of U1 are logic-1 and the outputs of U2 are logic-0, the result of the wired-AND operation at the input of gate U3 will be a logic-0 signal.

Figure 4:
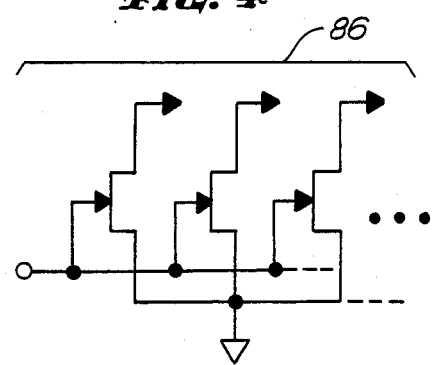
FIG. 4 is a fragmentary schematic diagram showing the structure of the output FET circuit of the gate of FIG. 1.

FIG. 4 shows how the multiple-drain FET 86 can be fabricated as multiple FET's with gates connected in common to a single gate terminal, and sources connected to a common ground. Other specific structures may, of course be used to perform an equivalent function, depending largely on the fabrication process employed.

Using computer simulations, the topology of the invention can be compared with other standard FET topologies for identical circuit applications. For example, a four-bit adder has been simulated for buffered FET logic (BFL) and differential current-mode logic (DCML), as well as for the wired-AND FET logic (WAFL) of the invention. The following table compares the numbers of parts, the propagation delay, and the power consumption for the three different topologies:

| Logic | Parts FETS | count Diodes | Res. | Tot. | Delay (ps) | Power (mW) |
|---|---|---|---|---|---|---|
| BFL | 277 | 315 | — | 592 | 870 | 372 |
| DCML | 465 | 942 | 90 | 1497 | 320 | 1181 |
| WAFL | 204 | 134 | — | 338 | 750 | 242 |

It is clear from the table that WAFL has a substantial advantage in propagation delay-power product over the other topologies, and has a substantial advantage also in terms of parts counts. Although the propagation delay for WAFL is greater than that of the DCML version, there is an almost five-fold power advantage over DCML.

It will be appreciated from the foregoing that the present invention represents a significant advance in the field of integrated circuitry using FET technology. In particular, the invention provides a basic logic gate that can be conveniently expanded and interconnected through the multiple inputs and outputs it provides. Moreover the logic gate of the invention has a significant delay-power product advantage over other approaches for the same general purpose. It will also be appreciated that, although a specific embodiment of the invention has been described in detail for purposes of illustration, various modifications may be made without departing from the spirit and scope of the invention. Accordingly, the invention is not to be limited, except as by the appended claims.

I claim:

1. A logic circuit comprising:

a plurality of wired-AND input circuits, each of which has a single pull-up field-effect transistor (FET) and a single input terminal connectable directly to a plurality of input signal lines to be logically ANDed together, the single input terminal being connectable to the plurality of input signal lines without any circuit elements being interposed between the input terminal and the plurality of input signal lines;

a FET output circuit having a common gate circuit and multiple independent drain output lines, which are connectable directly to input terminals of similar logic circuits, the multiple independent drain output lines being connectable to the input terminals of similar logic circuits without any circuit elements being interposed between the drain output lines and the input terminals; and circuit means for logically ORing the plurality of wired-AND input circuits and applying the resultant signal to the gate circuit of the FET output circuit;

wherein the FET output circuit acts as a voltage pull-down circuit when one or more of the outputs is applied to the input terminals of similar logic circuits, thereby allowing the one or more outputs to be applied to the input terminals of the similar logic circuits without any circuit elements being interposed between the one or more outputs and the input terminals, thus providing a logic circuit with fewer parts, low power dissipation and small time delays.

2. A logic circuit as set forth in claim 1, wherein the circuit means includes:

a plurality of diodes, for coupling each of the plurality of input circuits to a common junction point;

an additional diode connected between the common junction point and the gate circuit of the FET output circuit; and a pull-down FET connected between the gate circuit of the FET output circuit and a voltage source.

3. A logic circuit comprising:

a plurality of wired-AND input circuits, each of which has a single pull-up field-effect transistor (FET) and a single input terminal connectable directly to a plurality of input signal lines to be logically ANDed together, all of the pull-up FET's being connected to a signal power supply and the single input terminal being connectable to the plurality of input signal lines without any circuit elements being interposed between the input terminal and the plurality of input signal lines;

a FET output circuit having a common gate circuit and multiple independent drain output lines, which are connectable directly to input terminals of similar logic circuits, the multiple independent drain output lines being connectable to the input terminals of similar logic circuits without any circuit elements being interposed between the drain output lines and the input terminals;

a plurality of forward-biased diodes, for coupling each of the plurality of input circuits to a common junction point;

an additional diode connected between the common junction point and the gate circuit of the FET output circuit; and a pull-down FET connected between the gate circuit of the FET output circuit and a negative voltage source;

wherein the FET output circuit acts as a voltage pull-down circuit when one or more of the outputs is applied to the input terminals of similar logic circuits, thereby allowing the one or more outputs to be applied to the input terminals of the similar logic circuits without any circuit elements being interposed between the one or more outputs and the input terminals, thus providing a logic circuit with fewer parts, low power dissipation and small time delays, and wherein each wired-AND input circuit performs the AND of its multiple inputs, the resultant set of ANDed signals being ORed together at the junction point, and the result inverted prior to output.

4. A logic circuit as set forth in claim 3, wherein: all of the FET's operate in the depletion mode.

5. A logic circuit as set forth in claim 3, wherein: the FET output circuit includes multiple FET's having gates connected in common to a single gate terminal, sources connected together to ground, and drain terminals that form the multiple outputs.

* * * * *